(12) United States Patent  
Ochi et al.

(10) Patent No.: US 7,476,814 B2  
(45) Date of Patent: Jan. 13, 2009

(54) MULTILAYER INTERCONNECTION BOARD

(75) Inventors: Yoshiteru Ochi, Kawasaki (JP); Nobutaka Itoh, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/603,239

(22) Filed: Nov. 22, 2006

(65) Prior Publication Data

US 2008/0017412 A1 Jan. 24, 2008

(30) Foreign Application Priority Data

Jul. 18, 2006 (JP) .............................. 2006-196080

(51) Int. Cl.
  H01R 12/04 (2006.01)
  H05K 1/11 (2006.01)
(52) U.S. Cl. ................... 174/262; 174/264; 174/255
(58) Field of Classification Search ............... 174/264, 174/255, 262; 257/536
  See application file for complete search history.

(56) References Cited

U.S. PATENT DOCUMENTS 4,598,167 A  7/1986 Ushifusa et al.
5,874,770 A * 2/1999 Saia et al. .................. 257/536
6,329,610 B1 * 12/2001 Takubo et al. .............. 174/264
2006/0283625 A1 * 12/2006 Yamamichi et al. ......... 174/255

FOREIGN PATENT DOCUMENTS

| JP | 2000-223810 | 8/2000 |
| JP | 2002-359464 | 12/2002 |
| JP | 2003-163458 | 6/2003 |
| JP | 2004-87989 | 3/2004 |

* cited by examiner

Primary Examiner—Jeremy C Norris
Assistant Examiner—Andargie M Aychillhum
(74) Attorney, Agent, or Firm—Kratz, Quintos & Hanson, LLP

(57) ABSTRACT

A multilayer interconnection board includes a plurality of stacked insulation layers, wiring layers in the insulation layers, and via forming parts for interlayer connection, the via forming parts piercing the insulation layers. In the multilayer interconnection board, $0 < L2 \leq (L1/3)$ is set, where L1 denotes the distance between center positions of a pair of neighboring via forming parts formed in the same insulation layer and L2 denotes the shortest separation distance between the pair of the via forming parts.

7 Claims, 10 Drawing Sheets

MULTILAYER INTERCONNECTION BOARD

BACKGROUND OF THE INVENTION

1. Field of the Invention

The present invention generally relates to multilayer interconnection boards, and more specifically, to a multilayer interconnection board wherein a via forming part is used for interlayer connection.

2. Description of the Related Art

Recently and continuingly, high density mounting of electronic components such as semiconductor devices, for example, ICs (Integrated Circuits) or LSIs (Large Scale Integrations), is progressing. Because of this, the number of outside connection terminals provided at the electronic components is made large and pitches of the outside connection terminals are made narrow. Accompanying this, high density mounting of the electronic components on the multilayer interconnection board or a multilayer interconnection board structured with a large number of layers is progressing. See, for example, Japanese Laid-Open Patent Application No. 2003-163458.

Figure 1:
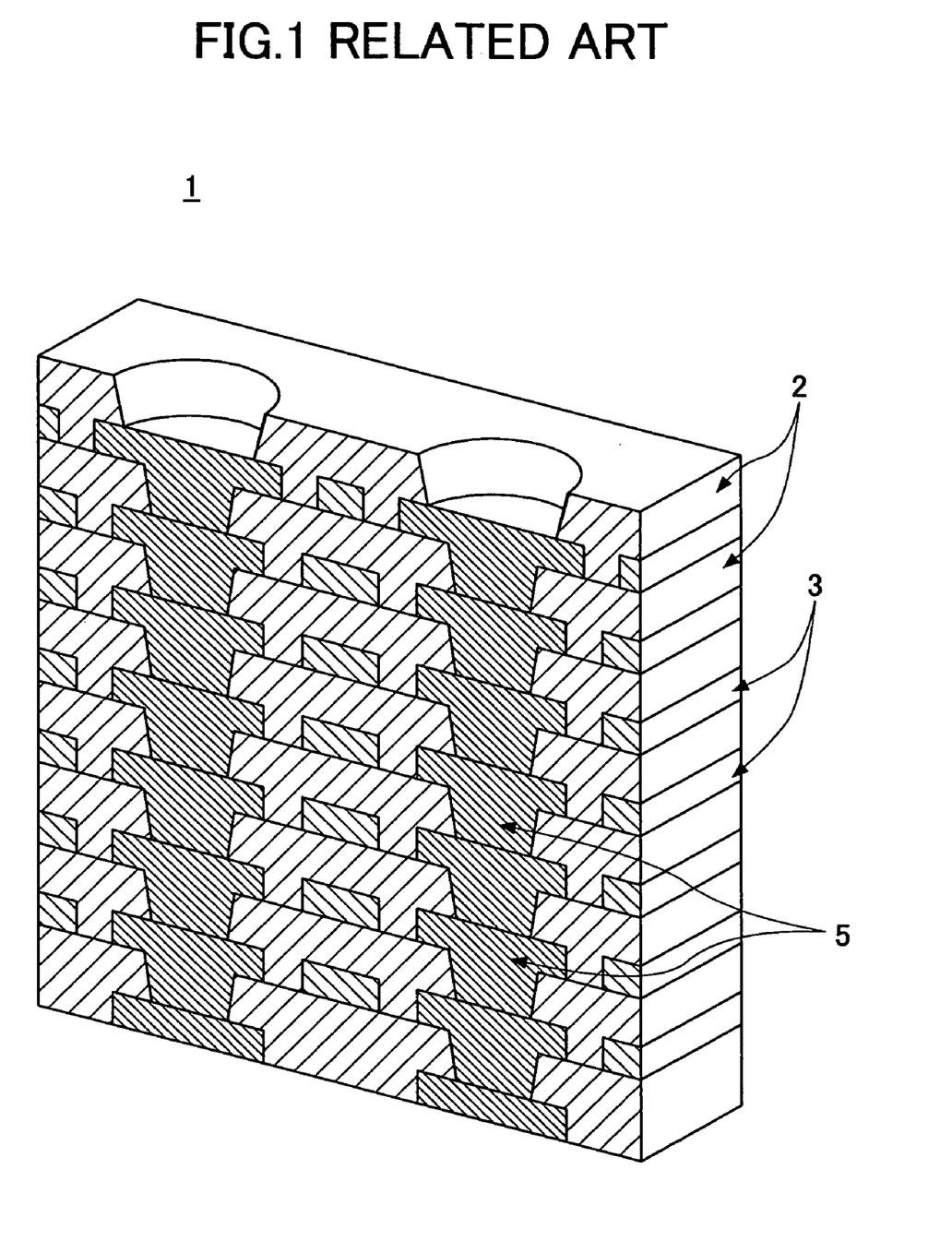
FIG. 1 is a three-dimensional cross-sectional view of a related art multilayer interconnection board.
Figure 2:
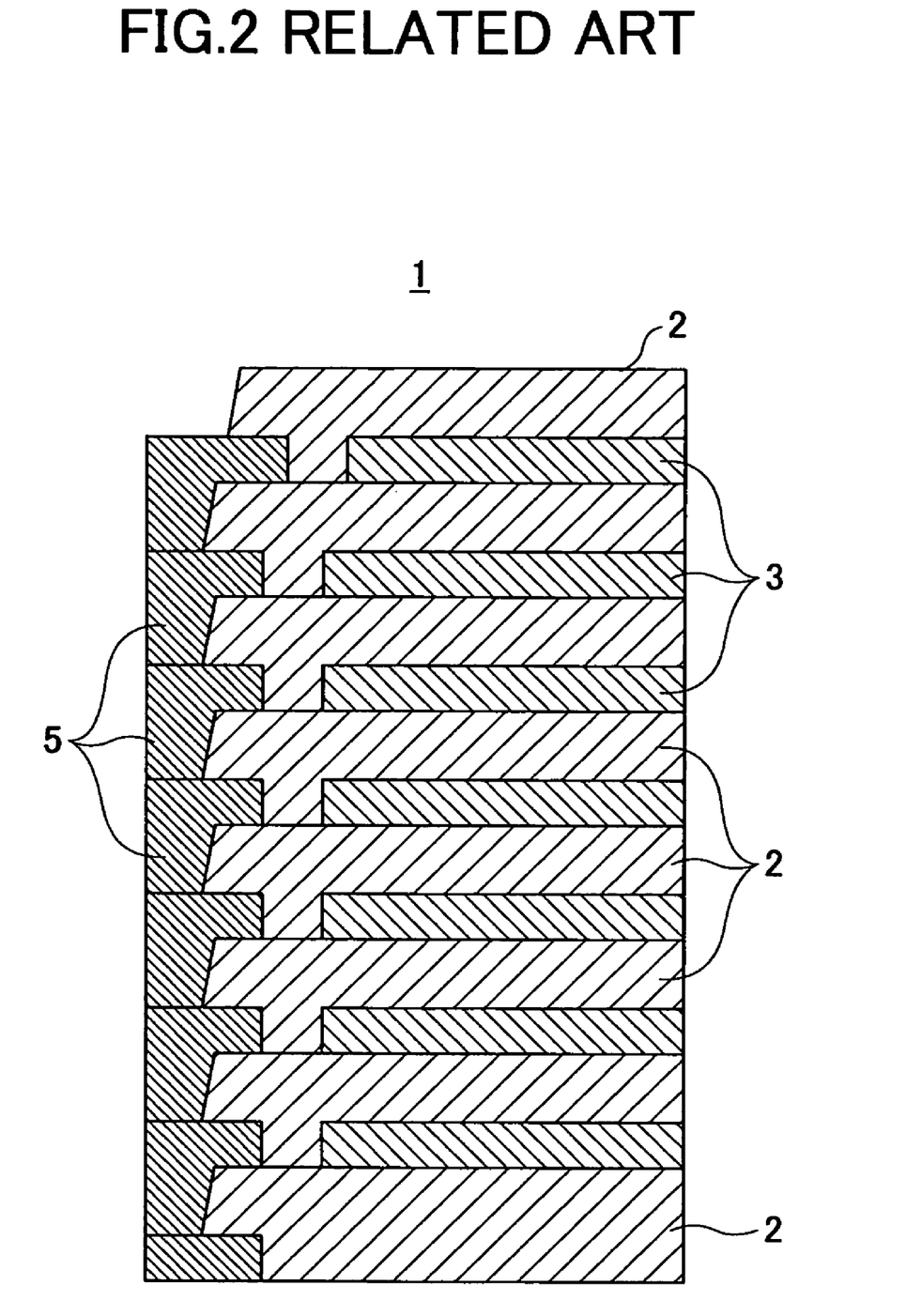
FIG. 2 is a cross-sectional view of the related art multilayer interconnection board shown in FIG. 1.

FIG. 1 is a three-dimensional cross-sectional view of a related art multilayer interconnection board 1. FIG. 2 is a cross-sectional view of the related art multilayer interconnection board 1 shown in FIG. 1.

As shown in FIG. 1 and FIG. 2, a multilayer interconnection board 1 has a structure where plural insulation layers 2 made of, for example, glass epoxy are stacked. A wiring layer 3 is formed in each of the insulation layers 2 in a designated pattern. The wiring layers 3 are interlayer-connected by via forming parts 5. The via forming part 5 is formed by forming a piercing hole forming part in the insulation layer 2 and a conductive metal such as copper (Cu) is formed inside the piercing hole forming part.

However, resin such as epoxy resin is a main ingredient of the insulation layer 2 of the multilayer interconnection board 1. In addition, the via forming part 5 is formed of a conductive metal such as copper (Cu). Hence, the coefficient of thermal expansion of the insulation layer 2 is different from the coefficient of thermal expansion of the via forming part 5. Because of this, for example, if heat is applied to the multilayer interconnection board 1 when an electronic component and others are mounted, for example, difference of the coefficients of thermal expansion between the insulation layer 2 and the via forming part 5 is generated.

If the difference of the coefficients of thermal expansion between the insulation layer 2 and the via forming part 5 is generated, stress is generated inside the multilayer interconnection board 1.

Figure 3:
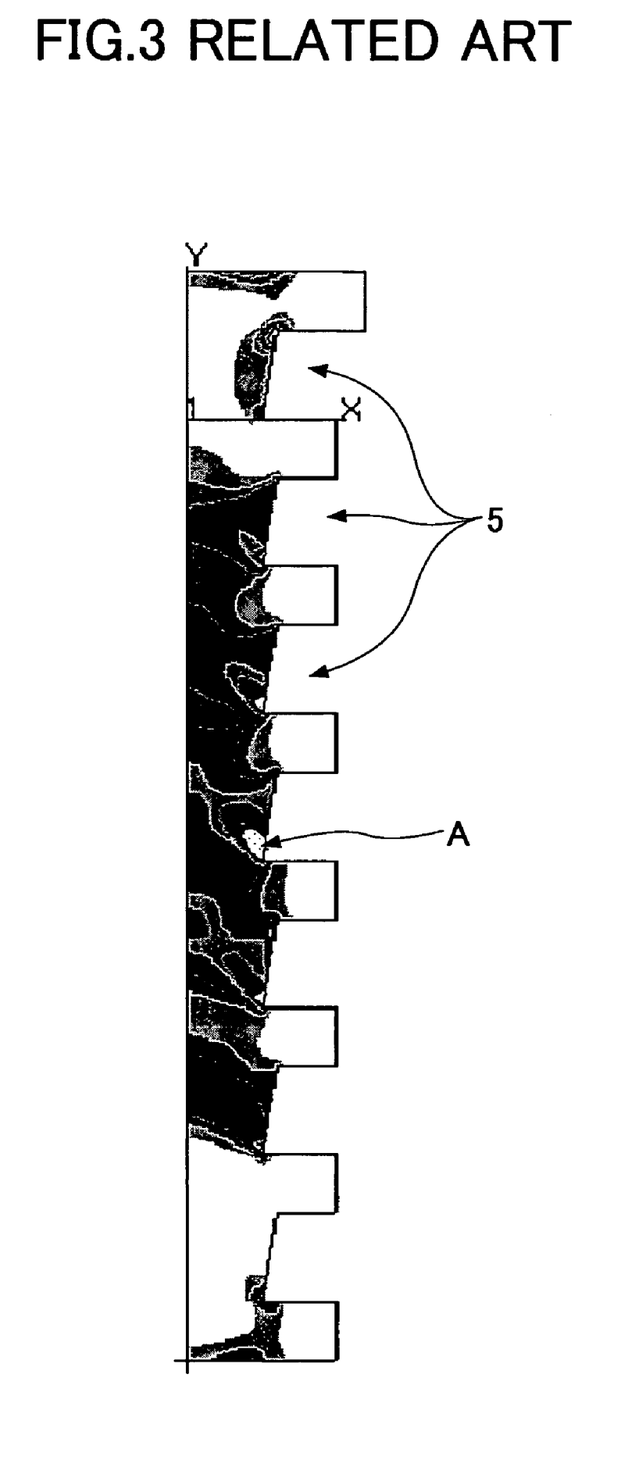
FIG. 3 is a view showing a result of simulation for explaining the maximum strain generated in the related art multilayer interconnection board.

FIG. 3 is a view showing a result of simulation for explaining the maximum strain generated due to the stress in the related art multilayer interconnection board 1.

As shown in FIG. 3, stress is easily generated in the vicinity of the center of the multilayer interconnection board 1. In addition, stresses are frequently generated at parts where diameters of lower end parts of the via forming parts 5 are narrow, namely a part indicated by an arrow A in FIG. 3. When the stress is concentrated on the lower end part of the via forming part 5, plastic strain is generated at this part. If such a plastic strain is further increased, a crack may be generated in the via forming part 5 or the via forming part 5 may be delaminated in a connection position.

SUMMARY OF THE INVENTION

Accordingly, embodiments of the present invention may provide a novel and useful multilayer interconnection board (MIB) solving one or more of the problems discussed above.

More specifically, the embodiments of the present invention may provide a multilayer interconnection board wherein cracks or delamination at, especially, a via forming position in a board can be prevented.

It may be an aspect of the present invention to provide a multilayer interconnection board, including a plurality of stacked insulation layers; wiring layers in the insulation layers; and via forming parts for interlayer connection, the via forming parts piercing the insulation layers; wherein $0 < L2 \leq (L1/3)$ is set, where L1 denotes the distance between center positions of a pair of neighboring via forming parts formed in the same insulation layer and L2 denotes the shortest separation distance between the pair of the via forming parts. In the multilayer interconnection board, $0 < L3 \leq (L1/3)$ may be set, where L3 denotes the shortest separation distance between the wiring layer and the via forming part. The insulation layer may be made of a glass epoxy material and the via forming part is made of copper (Cu).

It may also be an aspect of the present invention to provide a multilayer interconnection board, including: a plurality of stacked insulation layers; wiring layers in the insulation layers; and via forming parts for interlayer connection, the via forming parts piercing the insulation layers; wherein a configuration in the insulation layer of the via forming part is cylindrical-shaped. In the multilayer interconnection board, the insulation layer may be made of a glass epoxy material and the via forming part is made of copper (Cu).

It may also be an aspect of the present invention to provide a multilayer interconnection board, including: a plurality of stacked insulation layers; wiring layers in the insulation layers; and via forming parts for interlayer connection, the via forming parts piercing the insulation layers; wherein a configuration in the insulation layer of the via forming part is inverse taper-shaped where an upper part in a stacking direction of the insulation layer is narrower than a lower part in the stacking direction of the insulation layer. In the multilayer interconnection board, the insulation layer may be made of a glass epoxy material and the via forming part is made of copper (Cu).

It may also be an aspect of the present invention to provide a multilayer interconnection board, including: a plurality of stacked insulation layers; wiring layers in the insulation layers; and via forming parts for interlayer connection, the via forming parts piercing the insulation layers; wherein a curved part is formed at a lower end part in the stacking direction of the insulation layer in the insulation layer of the via forming part. In the multilayer interconnection board, the insulation layer may be made of a glass epoxy material and the via forming part is made of copper (Cu).

According to the above-mentioned multilayer interconnection board, since the distance between a pair of the neighboring via forming parts formed in the same insulation layer and the distance between the via forming part and the wiring later are shortened, the via forming part has a configuration whereby stress may not be concentrated. Therefore, it is possible to prevent the crack or delamination from being generated in a via forming part connection position.

Other objects, features, and advantages of the present invention will be come more apparent from the following detailed description when read in conjunction with the accompanying drawings.

DETAILED DESCRIPTION OF THE PREFERRED EMBODIMENTS

A description is given below, with reference to the FIG. 4 through FIG. 10 of embodiments of the present invention.

First Embodiment of the Present Invention

Figure 4:
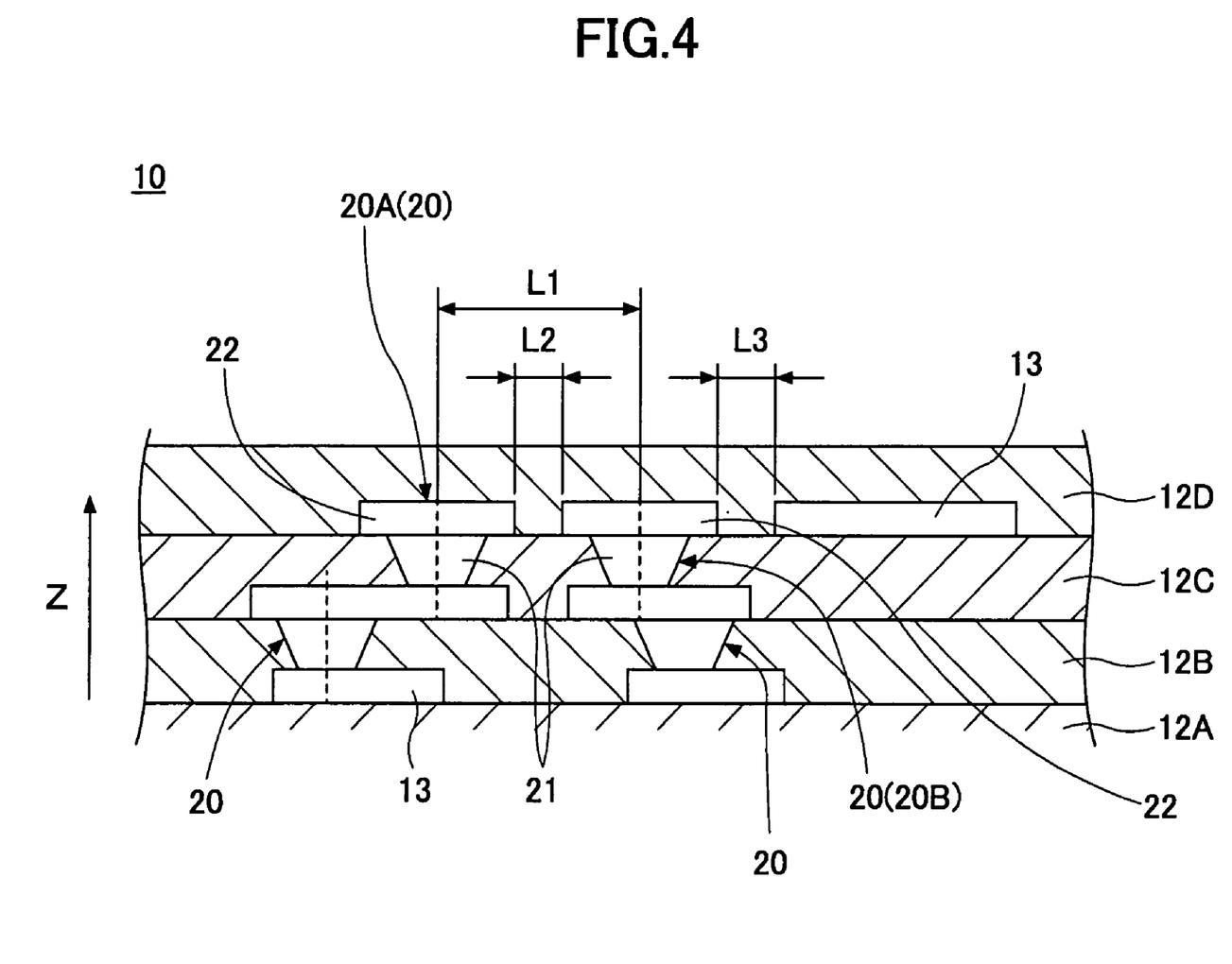
FIG. 4 is a partial cross-sectional view of a multilayer interconnection board of a first embodiment of the present invention.

FIG. 4 is an enlarged cross-sectional view of a multilayer interconnection board 10 of a first embodiment of the present invention. As shown in FIG. 4, a multilayer interconnection board 10 has a structure where four insulation layers 12A through 12D are stacked. Via forming parts 20 are formed in the insulation layer 12B and the insulation layer 12C. In addition, wiring layers 13 are formed in the insulation layers 12B and 12D.

In the first embodiment of the present invention, glass epoxy where epoxy resin is dipped is used as the insulation layers 12A through 12D. However, a material of the insulation layer 12A through 12D is not limited to this. For example, other insulation resins such as polyimide or PPE (polyphenylether) may be used as the insulation layers 12A through 12D.

Figure 7:
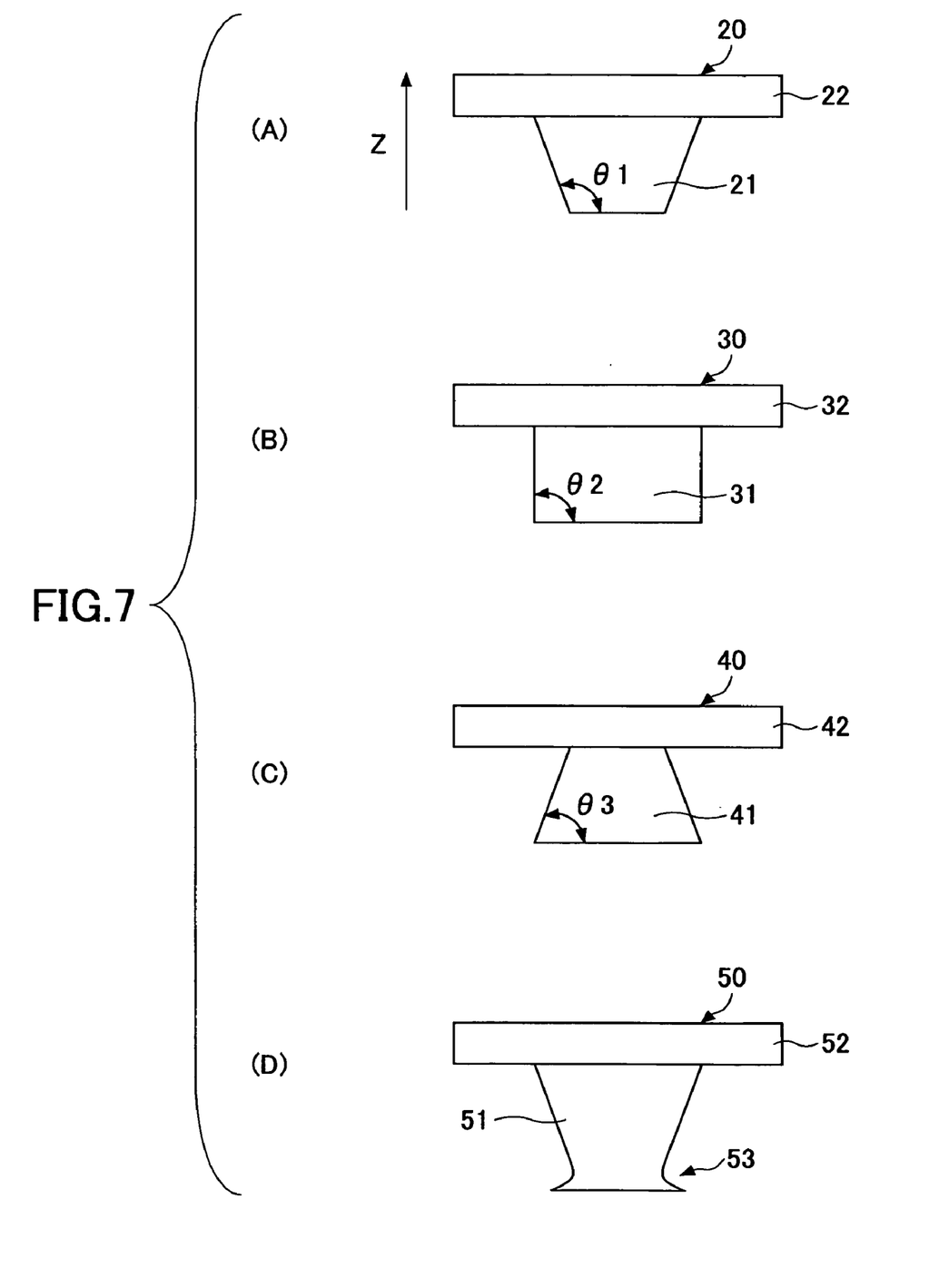
FIG. 7 is a view for explaining via forming parts provided in multilayer interconnection boards of second through fourth embodiments of the present invention.

The via forming part 20 is formed by a conductive metal such as copper (Cu). As enlarged and shown in FIG. 7(A), the via forming part 20 includes a via main body 21 and a land part 22. The via main bodies 21 are positioned in piercing holes formed in the insulation layers 12B and 12C. As discussed below, various configurations of the via main bodies 21 may be formed. Piercing holes are formed in the insulation layers 12B and 12C by a laser processing and copper (Cu) is plated inside the piercing holes so that the via main bodies 21 are formed.

In addition, land parts 22 are formed on upper end parts of the via main bodies 21 in flange shapes. The land parts 22 are connected to bumps situated in other layers or connected to the wiring layers 13 in the same layers. The wiring layers 13 are formed by copper (Cu) in designated patterns. When the land part 22 is connected to the wiring layer 13 formed in the same layer, the land part 22 and the wiring layer 13 may be formed in a unified manner.

In the meantime, the multilayer interconnection board 10 has a structure where the insulation layer 12 (12A through 12D) is made of a material whose main ingredient is resin such as epoxy resin and the via forming part 20 (21, 22) is formed by a conductive metal such as copper (Cu). Hence, the coefficient of thermal expansion of the insulation layer 12 is different from the coefficient of thermal expansion of the via forming part 20, and thereby the difference between the coefficients of thermal expansion may be problematic when heat is applied.

Figure 5:
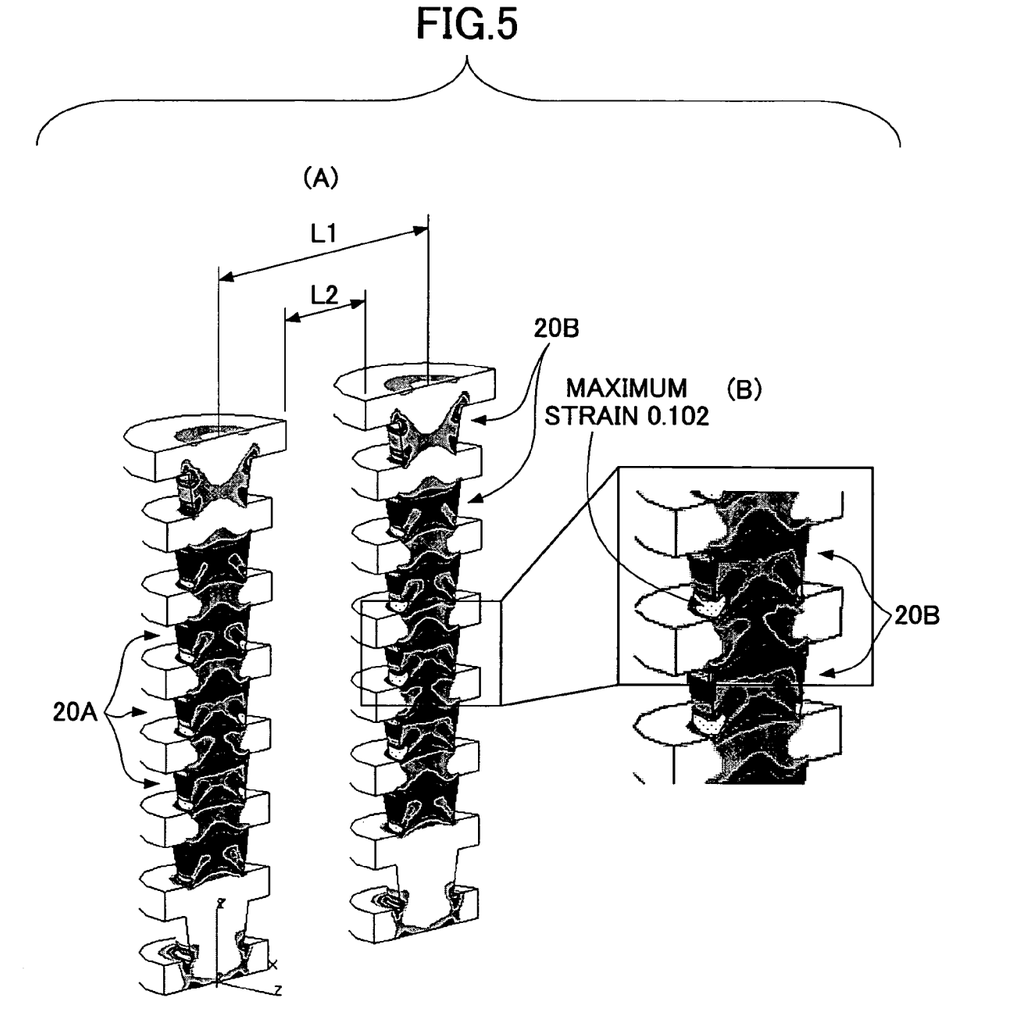
FIG. 5 is a view showing a result of simulation for explaining the maximum strain generated in the multilayer interconnection board of the first embodiment of the present invention.

Inventors of the present invention formed a model shown in FIG. 5 where seven via forming parts 20 are stacked. The inventors have simulated change of maximum plastic strain when a shortest separating distance L2 between a pair of neighboring via forming parts 20A and 20B is changed relative to the distance between center positions of the pair of neighboring via forming parts 20A and 20B. The result of the simulation is shown by a solid line, namely a line indicated by an arrow X1, in FIG. 6.

Figure 6:
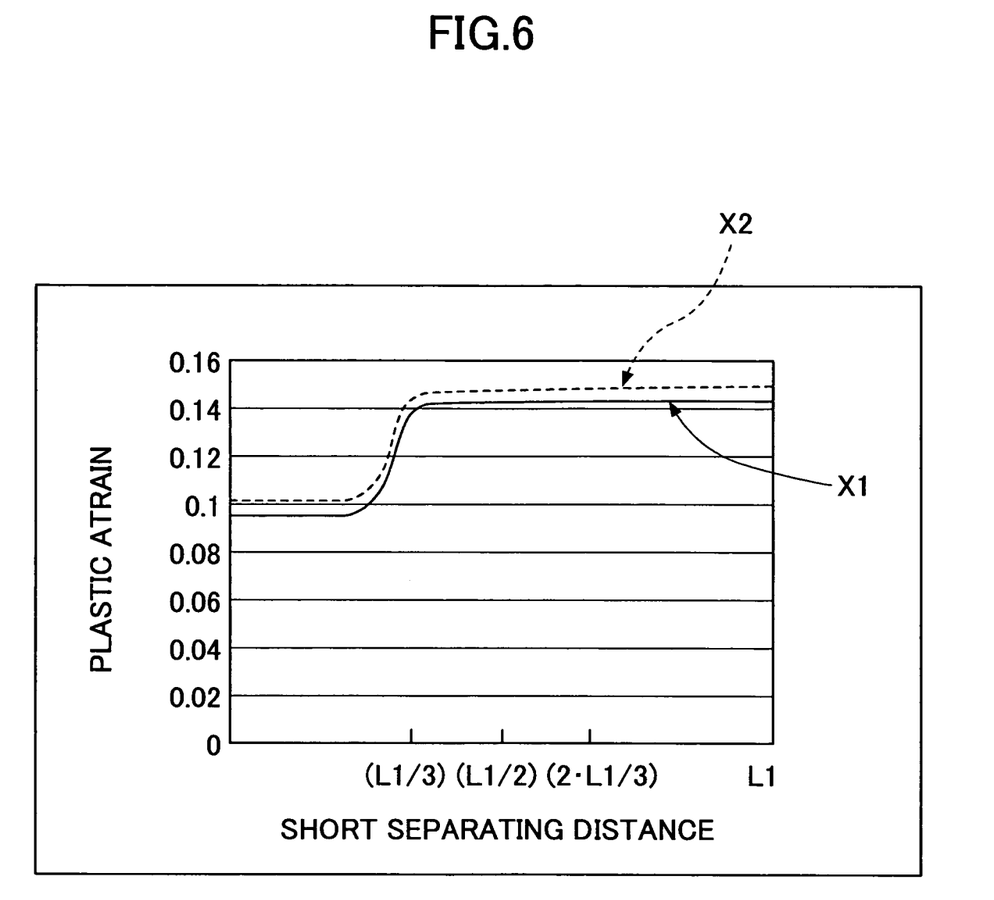
FIG. 6 is a graph showing a relationship between distance between via forming parts and distance between the via forming part and a wiring layer and plastic strain.

Here, FIG. 5 is a view showing a result of simulation for explaining a maximum strain generated in the multilayer interconnection board of the first embodiment of the present invention. FIG. 6 is a graph showing relationships between distance between the via forming parts and distance between the via forming part and the wiring layer, and plastic strain. The horizontal axis represents a shortest separating distance L2 and the vertical axis of the graph shows plastic strain.

FIG. 6 shows an area of the shortest separating distance L2 that is 0 through L1. In addition, since the diameter of the via forming part 20 (20A, 20B) at the land part 22 is larger than the diameter of the via forming part 20 (20A, 20B) at the via main body 21, the shortest separating distance L2 is the distance between neighboring land parts 22. See FIG. 4 and FIG. 5.

As shown in FIG. 6, when the shortest separating distance L2 is defined as $(L1/3) < L2 \leq L1$, the plastic strain value is approximately 0.145 and substantially constant. Because of this, if the shortest separating distance L2 is defined as $(L1/3) < L2 \leq L1$, when the multilayer interconnection board 10 is heated, cracks may be generated in the via forming parts 20 (20A, 20B) or delaminating may happen in the connecting position.

On the other hand, if the shortest separating distance L2 is shorter than (L1/3), the plastic strain is reduced. If the shortest separating distance L2 is defined as $0 < L2 \leq (L1/3)$, the plastic strain value is approximately 0.097. It is known from experience that cracks may not be generated in the via forming parts 20 (20A, 20B) or delaminating may not happen due to such a plastic strain. Therefore, by setting the shortest separating distance L2 of the pair of the neighboring via forming parts 20A and 20B formed in the insulation layer to be defined as $0 < L2 \leq (L1/3)$, generation of the cracks or delaminating in the via forming parts 20 (20A, 20B) formed in the multilayer interconnection board 10 can be prevented so that reliability of the multilayer interconnection board 10 can be improved.

On the other hand, in the same insulation layer such as the insulation layer 12B in FIG. 4, the wiring layer 13 is provided together with the via forming part 20. Since the wiring layer 13 is made of a metal material such as copper (Cu), stress due to the difference of coefficients of thermal expansion between the wiring layer 13 and the insulation layer 12C may be generated. If the via forming part 20 exists in the vicinity of the wiring layer 13, cracking or delaminating may be generated at the lower end of the via forming part 20 due to the stress.

Because of this, the inventors of the present invention made a model where the wiring layer 13 instead of the via forming part 20B is provided and simulated change of maximum plastic strain when the shortest separating distance L3 between neighboring via forming part 20A and the wiring layer 13 is changed. More specifically, the shortest separating distance L2 is changed in a state where the distance L1 between center positions of a pair of the via forming parts 20A and 20B whose separating distance is shortest among plural via forming parts 20 provided in the same insulation layer such as the insulation layer 12C is a standard distance. The result of the simulation is shown by a dotted line indicated by an arrow X2 in FIG. 6.

As shown in FIG. 6, the change of maximum plastic strain when the shortest separating distance L3 between the via forming part 20A and the wiring layer 13 is changed is substantially the same as the change of maximum plastic strain when the shortest separating distance L3 between the via forming parts 20A and 20B is changed. In other words, when the shortest separating distance L3 is defined as (L1/3) <L3≦L1, the plastic strain value is approximately 0.148 and substantially constant. Because of this, if the shortest separating distance L3 is defined as (L1/3)<L3≦L1, when the multilayer interconnection board 10 is heated, cracks may be generated in the via forming parts 20 (20A) or delaminating may happen in the connecting position.

On the other hand, if the shortest separating distance L3 is shorter than (L1/3), the plastic strain is reduced. If the shortest separating distance L3 is defined as 0<L3≦(L1/3), the plastic strain value is approximately 0.102. It is known from experience that cracks may not be generated in the via forming part 20 (20A) or delaminating may not happen due to such a plastic strain. Therefore, by setting the shortest separating distance L3 between the pair of the neighboring via forming part 20 and the wiring layer 13 formed in the insulation layer to be defined as 0<L3≦(L1/3), generation of cracks or delaminating in the via forming part 20 (20A) formed in the multilayer interconnection board 10 can be prevented so that reliability of the multilayer interconnection board 10 can be improved.

Second through Fourth Embodiments of the Present Invention

Next, multilayer interconnection boards of second through fourth embodiments of the present invention are discussed. Since only configurations of via forming parts of the multilayer interconnection boards of second through fourth embodiments of the present invention are different from that of the multilayer interconnection board 10 of the first embodiment of the present invention shown in FIG. 4, for the convenience of explanation, only the via forming part is shown in FIG. 7 and discussed in the following explanation.

FIG. 7 is a view for explaining via forming parts provided in multilayer interconnection boards of second through fourth embodiments of the present invention.

FIG. 7(A) shows the via forming part 20 used in the multilayer interconnection board 10 of the first embodiment of the present invention. As discussed above, the via forming part 20 is formed by the via main body 21 and the land part 22. The via main body 21 positioned in a piercing hole formed in the insulation layers 12B and 12C has a taper configuration where an upper part in a stacking direction of insulation layers 12A through 12D indicated by an arrow Z in FIG. 7(A) is wider than a lower part. The via forming part having this configuration is called a standard via forming part. In the standard via forming part 20, an angle θ1 between a side surface of the via main body 21 and the horizontal direction is greater than 90 degrees.

On the other hand, FIG. 7(B) shows a via forming part 30 used in the multilayer interconnection board of the second embodiment of the present invention. The via forming part 30 is formed by a via main body 31 and a land part 32. The via main body 31 has a cylindrical-shaped configuration having a constant diameter in the stacking direction indicated by the arrow Z. In the via forming part 30, an angle θ2 between a side surface of the via main body 31 and the horizontal direction is equal to approximately 90 degrees.

In addition, FIG. 7(C) shows a via forming part 40 used in the multilayer interconnection board of the third embodiment of the present invention. The via forming part 40 is formed by a via main body 41 and a land part 42. The via main body 41 has a taper configuration where an upper part in a stacking direction by the arrow Z in FIG. 7(C) is narrower than a lower part. In the via forming part 40, an angle θ3 between a side surface of the via main body 41 and the horizontal direction is smaller than 90 degrees.

In addition, FIG. 7(D) shows a via forming part 50 used in the multilayer interconnection board of the fourth embodiment of the present invention. The via-forming part 50 is formed by a via main body 51 and a land part 52. A hollow ring part 53 is formed at a lower end of the via main body 51 in a stacking direction by the arrow Z in FIG. 7(D). The hollow ring part 53 is a curved configuration having a radius R. The radius R has a designated value. In the following explanations, the hollow ring part 53 is called a corner R53.

The inventors of the present invention implemented a simulation to know a state of generation of maximum plastic strain by applying a temperature cycle to the via forming parts 20, 30, 40 and 50 shown in FIG. 7. More specifically, a model of seven layers of the via forming parts 20, 30, 40 and 50 is made. A temperature cycle equivalent to that used for reliability testing such as burn-in is applied to a semiconductor device manufacturing apparatus and a maximum plastic strain generated at that time is simulated.

Figure 8:
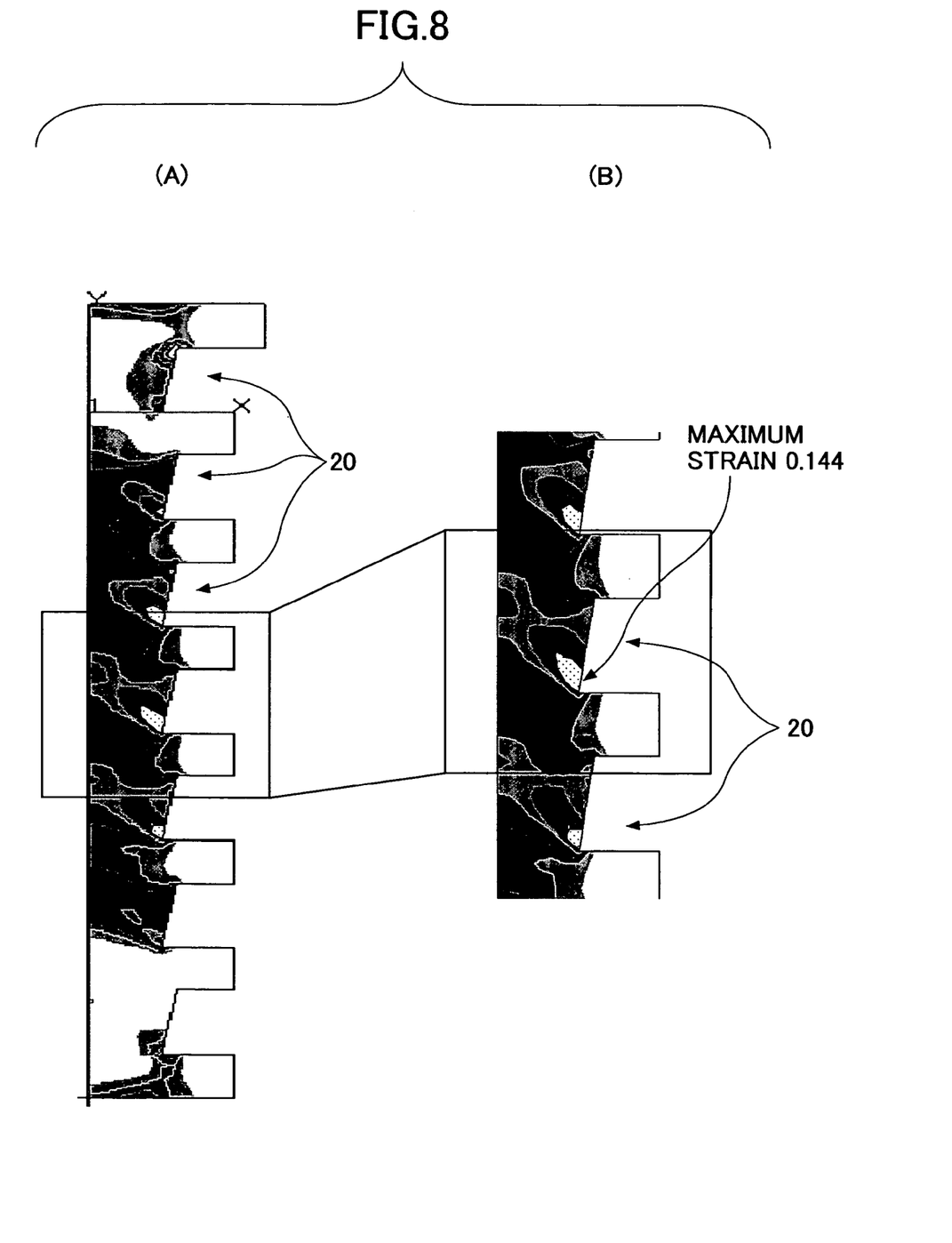
FIG. 8 is a view of a result of simulation showing distribution of plastic strain generated when eight layers of standard type via forming parts used in the first embodiment of the present invention are stacked.
Figure 9:
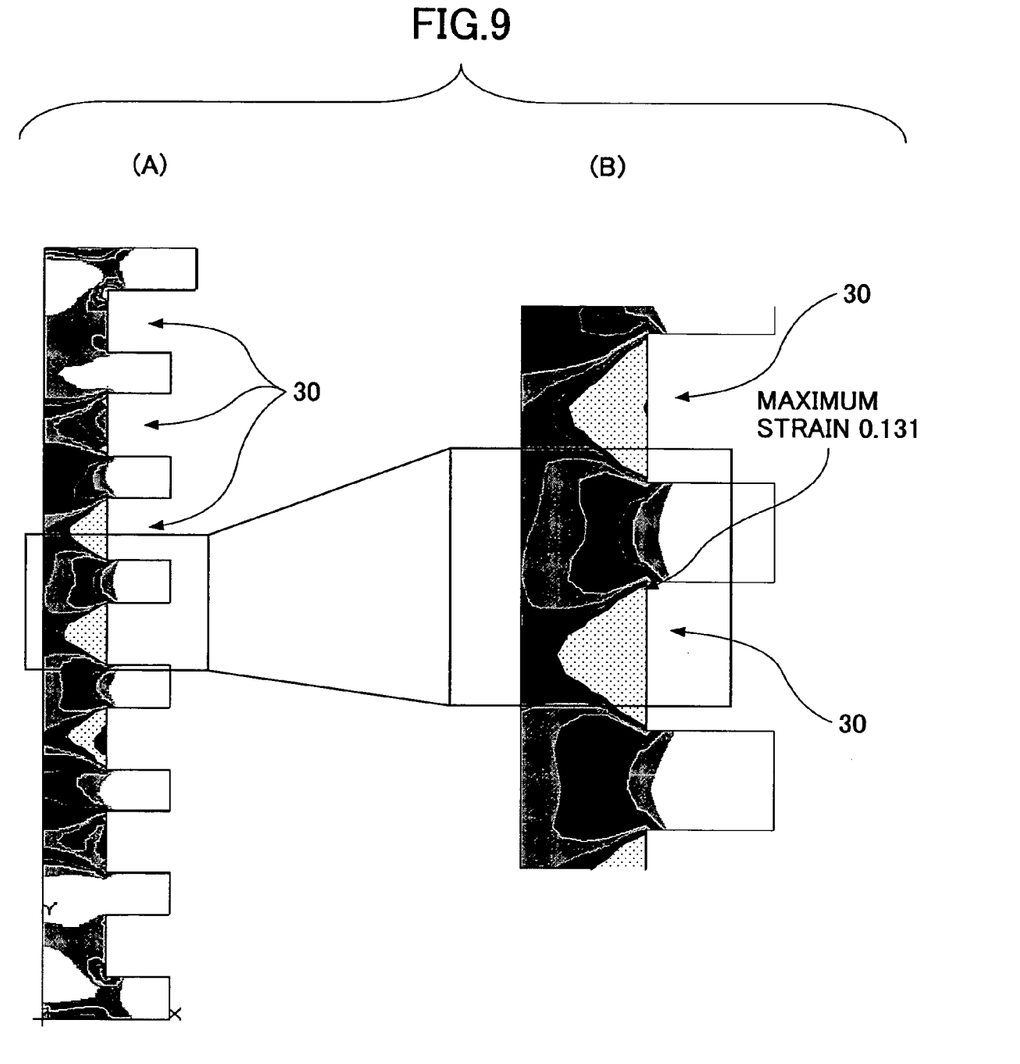
FIG. 9 is a view of a result of simulation showing distribution of plastic strain generated when eight layers of via forming parts whose via main bodies used in the second embodiment of the present invention have cylindrical-shaped configurations are stacked.

FIG. 8 is a view of a model used for simulation to the standard via forming part 20. FIG. 9 is a view of a model used for simulation to the via forming part 30.

In the case of the standard via forming part 20 shown in FIG. 8, a maximum plastic strain is generated in the standard via forming part 20 situated at the forth step from the upper side and has a value of 0.144. Similarly, in the case of the via forming part 30 shown in FIG. 9, a maximum plastic strain is generated in the via forming part 30 situated at the forth step from the upper side and has a value of 0.131. The substantially same process is implemented for the via forming parts 40 and 50 and results are shown in FIG. 10.

Figure 10:
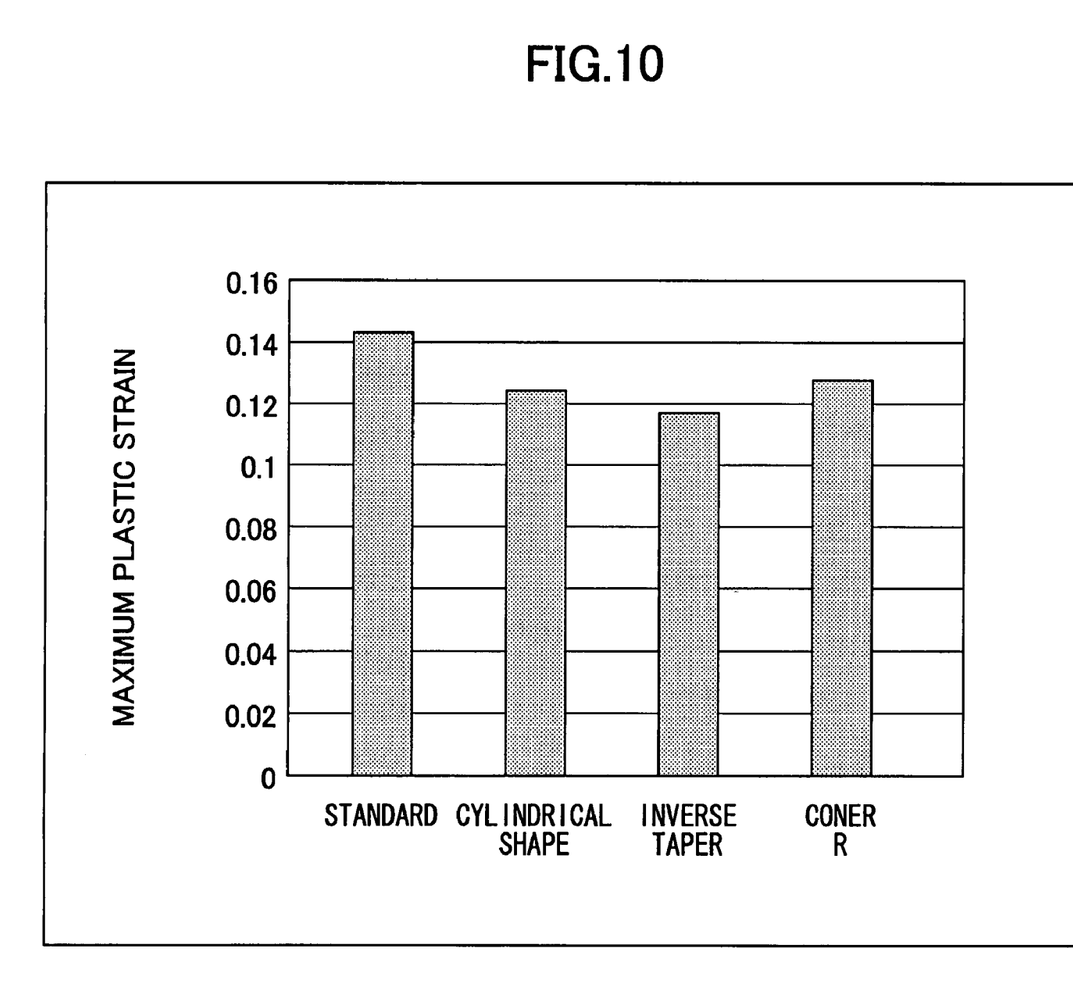
FIG. 10 is a graph showing comparison of maximum values of plastic strains generated when eight layers of the via forming parts used in the second through fourth embodiments of the present invention are stacked.

As shown in FIG. 10, as compared to the standard via forming part 20, each of the via forming part 30 having the cylindrical-shaped via main body 31, the via forming part 40 having the via main body 41 having the opposite taper configuration, and the via forming part 50 where the corner R53 is formed in the via main body 51 has a smaller maximum plastic strain value. Therefore, by using the via forming part 30, 40 or 50 as a via forming part formed in the multilayer interconnection board, the stress generated in the multilayer interconnection board can be reduced. Hence, it is possible to realize the multilayer interconnection board having high reliability where cracking or delaminating is not generated in the via forming part 30, 40 or 50.

The present invention is not limited to these embodiments, but variations and modifications may be made without departing from the scope of the present invention.

This patent application is based on Japanese Priority Patent Application No. 2006-196080 filed on Jul. 18, 2006, the entire contents of which are hereby incorporated by reference.

What is claimed is:

1. A multilayer interconnection board, comprising:
    a plurality of stacked insulation layers;
    wiring layers in the insulation layers; and
    via forming parts for interlayers connection, the via forming parts piercing the insulation layers;
    wherein $0 < L2 \leq (L1/3)$ is set, where L1 denotes the distance between center positions of a pair of neighboring via forming parts formed in the same insulation layer and L2 denotes the shortest separation distance between the pair of the via forming parts.

2. The multilayer interconnection board, as claimed in claim 1,
    wherein $0 < L3 \leq (L1/3)$ is set, where L3 denotes the shortest separation distance between the wiring layer and the via forming part.

3. The multilayer interconnection board, as claimed in claim 1,
    wherein the insulation layer is made of a glass epoxy material and the via forming part is made of copper (Cu).

4. A multilayer interconnection board, comprising:
    a plurality of stacked insulation layers; wiring layers in the insulation layers; and via forming parts for interlayer connection, the via forming parts piercing the insulation layers; wherein a configuration in the insulation layer of the via forming part is inverse taper-shaped where an upper part in a stacking direction of the insulation layer is narrower than a lower part in the stacking direction of the insulation layer; wherein $0 < L2 \leq (L1/3)$ is set, where L1 denotes the distance between center positions of a pair of neighboring via forming parts formed in the same insulation layer and L2 denotes the shortest separation distance between the pair of the via forming parts.

5. The multilayer interconnection board, as claimed in claim 4,
    wherein the insulation layer is made of a glass epoxy material and the via forming part is made of copper (Cu).

6. A multilayer interconnection board, comprising:
    a plurality of stacked insulation layers; wiring layers in the insulation layers; and via forming parts for interlayer connection, the via forming parts piercing the insulation layers; wherein a curved part is formed at a lower end part in the stacking direction of the insulation layer in the insulation layer of the via forming part; wherein $0 < L2 \leq (L1/3)$ is set, where L1 denotes the distance between center positions of a pair of neighboring via forming parts formed in the same insulation layer and L2 denotes the shortest separation distance between the pair of the via forming parts.

7. The multilayer interconnection board, as claimed in claim 6,
    wherein the insulation layer is made of a glass epoxy material and the via forming part is made of copper (Cu).

* * * * *